United States Patent [19]

Tsuno et al.

[11] Patent Number: 4,520,264

[45] Date of Patent: May 28, 1985

[54] ELECTRON MICROSCOPE

[75] Inventors: Katsushige Tsuno; Toshikazu Honda, both of Akishimashi, Japan

[73] Assignee: JEOL Ltd., Tokyo, Japan

[21] Appl. No.: 482,880

[22] Filed: Apr. 7, 1983

[30] Foreign Application Priority Data

Apr. 8, 1982 [JP] Japan .................................. 57-59432
Apr. 23, 1982 [JP] Japan .................................. 57-68258

[51] Int. Cl.³ ...................... H01J 37/26; H01J 37/141
[52] U.S. Cl. ............................ 250/311; 250/396 ML; 250/398
[58] Field of Search ........... 250/311, 396 R, 396 ML, 250/310, 398, 492.2

[56] References Cited

U.S. PATENT DOCUMENTS 3,746,855  7/1973  Hilditch ..................... 250/396 R X Primary Examiner—Alfred E. Smith
Assistant Examiner—Jack I. Berman
Attorney, Agent, or Firm—Webb, Burden, Robinson & Webb

[57] ABSTRACT

In an electron microscope, having intermediate lenses between the object and the projection lenses, the first and second intermediate lenses are used for rotating the final electron microscope image without changes in magnification. The desired angle signal indicating to azimuth angle $\theta$ is designated by an operator. The absolute magnetomotive force $|J1|$ and $|J2|$ of the first and second intermediate lenses are controlled by a lens control means in the relation that $(|J1| - |J2|)$ is proportional to the azimuth angle $\theta$ and $(|J1| + |J2|)$ is nearly proportional to the square of the azimuth angle $\theta$.

7 Claims, 9 Drawing Figures

ELECTRON MICROSCOPE

BACKGROUND OF THE INVENTION

This invention relates to an image forming lens system which can rotate a final image without the necessity of an additional or special electromagnetic lens or lenses in a transmission electron microscope.

In many conventional electron microscopes, the image forming lens system (consisting of an objective lens, a projector lens and more than two intermediate lenses between the objective lens and the projector lens) forms the final electron microscope image on a fluorescent screen or a photo plate. The lenses are usually all electromagnetic types, so that the orientation (or azimuth situation) of the final image on the fluorescent screen rotates by angle $\theta$ about the optical axis of the image forming lens system from the orientation of the corresponding specimen. The said azimuth (or rotation) angle $\theta$ is given by the following equation.

$$\theta = \left(\frac{e}{8mVr}\right)^{\frac{1}{2}} \int_{Zs}^{Ze} Bz \cdot dz$$

wherein,
 e is the charge of an electron;
 m is the rest mass of an electron;
 Vr is the accelerating voltage of the electron beam corrected for the "principle of relativity";
 Bz is the magnetic field intensity along the optical axis Z of the image forming lens system;
 Zs is the specimen position on the optical axis;
 Ze is the final image position on the optical axis.
In the above equation, the term $$\left(\frac{e}{8mVr}\right)^{\frac{1}{2}}$$

has a constant value. And the integral value of Bz from Zs to Ze equals to the total excitation (magnetomotive force) NI (ampere turns) of the electromagnetic lenses between the specimen and the final image.

When the final image is photographed, the rectangular part at the center of the fluorescent screen is removed so that the final image is projected on the photo plate located under the fluorescent screen. So it is often desired to rotate the final image on the photo plate so as to fit that portion of the field of view being of interest into the shape of the rectangular photo plate. It is possible to vary or adjust the azimuth situation of the final image on the screen by changing the magnetomotive force NI of some lens member in the image forming lens system. By so doing, in the conventional electron microscope, however, the magnification of the final image is also varied due to changes in the focal length of the lens member in the image forming lens system.

SUMMARY OF THE INVENTION

One object of the invention is to provide an electron microscope capable of rotating the final image by some desired amount without changing magnification of the final image.

Another object of the invention is to provide an electron microscope capable of rotating the final image without significantly increasing radial distortion.

Yet another object of the invention is to provide an electron microscope capable of rotating the final image without the necessity of an additional or special electromagnetic lens or lenses.

An electron microscope according to the invention comprises an image forming lens system consisting of an objective lens, a projector lens and at least two intermediate lenses between the objective lens and the projector lens; a signal generator for generating an azimuth angle signal corresponding to the desired azimuth angle $\theta$ of the final image formed by said image forming lens system; and a lens control unit for controlling the excitation currents applied to said intermediate lenses and said projector lens in response to said azimuth angle signal. In one embodiment of this invention, said lens control unit controls the magnetomotive force values J1 and J2 of said intermediate lenses so that the difference between the absolute magnetomotive force values $|J1|$ and $|J2|$ is proportional to said azimuth angle $\theta$, the sum of the absolute values $|J1|$ and $|J2|$ is nearly proportional to the square of said azimuth angle $\theta$ and the direction of image rotation due to said intermediate lenses is opposite with respect to each other.

DESCRIPTION OF THE PREFERRED EMBODIMENT

Figure 1:
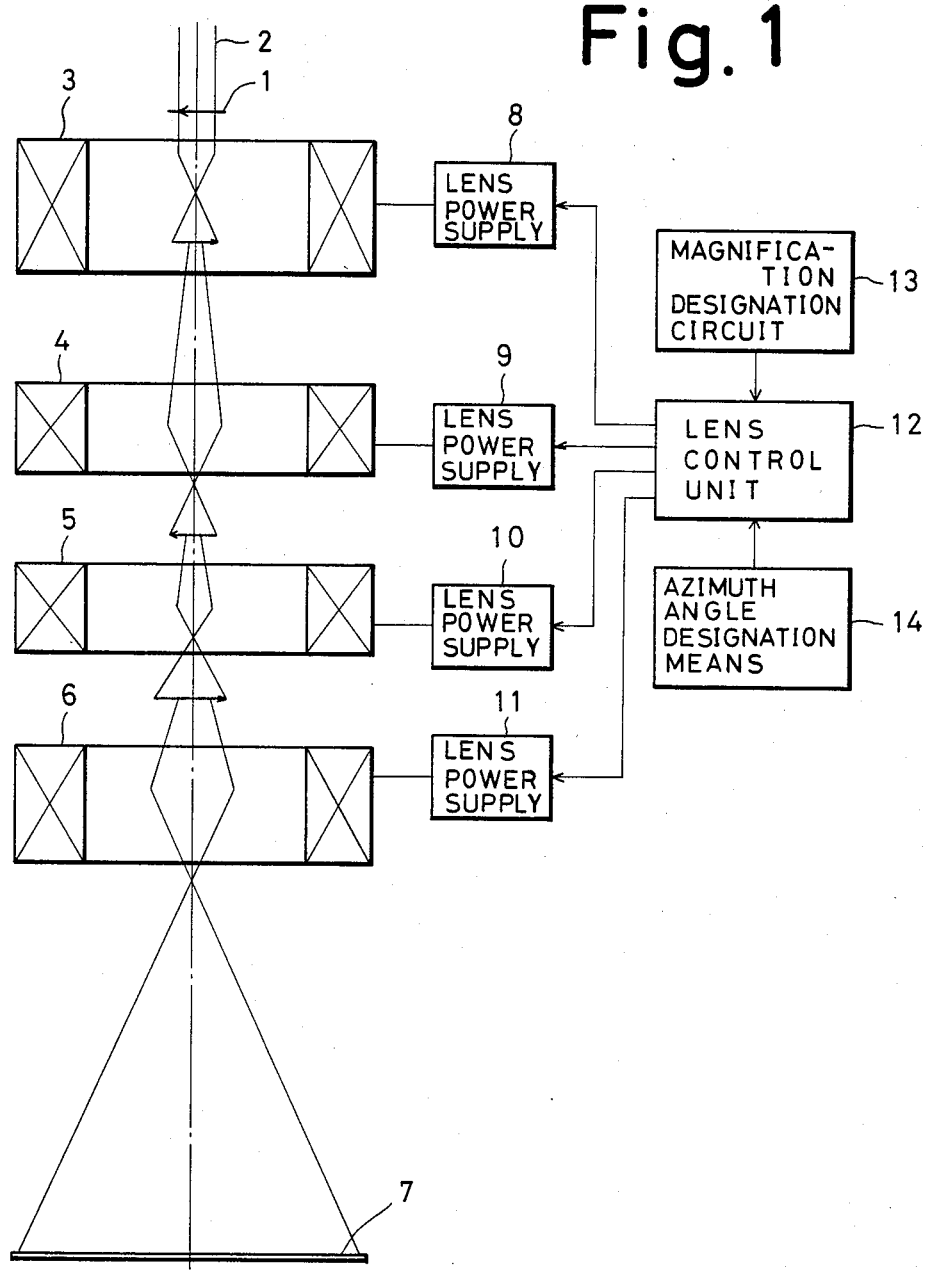
FIG. 1 is a schematic drawing showing one embodiment according to the invention.

FIG. 1 schematically shows an electron microscope according to the invention. In the figure, a thin film specimen 1 is irradiated with a parallel beam 2 which is accelerated, for example, by an accelerating voltage of 200 KV in an electron gun (not shown). The electron beam transmitted through the specimen 1 forms the final electron microscope image on a fluorescent screen 7 by an image forming lens system consisting of an objective lens 3, a first intermediate lens 4, a second intermediate lens 5 and a projector lens 6. These lenses 3, 4, 5, and 6 have their own independent lens power supplies 8, 9, 10, and 11, outputs of which are controlled according to the control signals supplied from a lens control unit 12. The lens control unit 12 (for example, having a microprocessor therein) is supplied with a magnification signal from a magnification designation means 13 and with an azimuth angle signal from an azimuth angle designation means 14. The lens control unit 12 supplies control signals to the lens power supplies 9 and 10, so that the direction of the image rotation due to the first and second intermediate lenses 4 and 5 is always opposite with respect to each other. Accordingly, the magnetomotive force J1 of the first intermediate lens 4 and the magnetomotive force J2 of the second intermediate lens 5 always have opposite polarity with respect to each other, and also the polarity of the excitation currents of said intermediate lenses 4 and 5 are always kept opposite with respect to each other in the case that the winding direction of the lens coil of the lenses 4 and 5 is the same.

Figure 2:
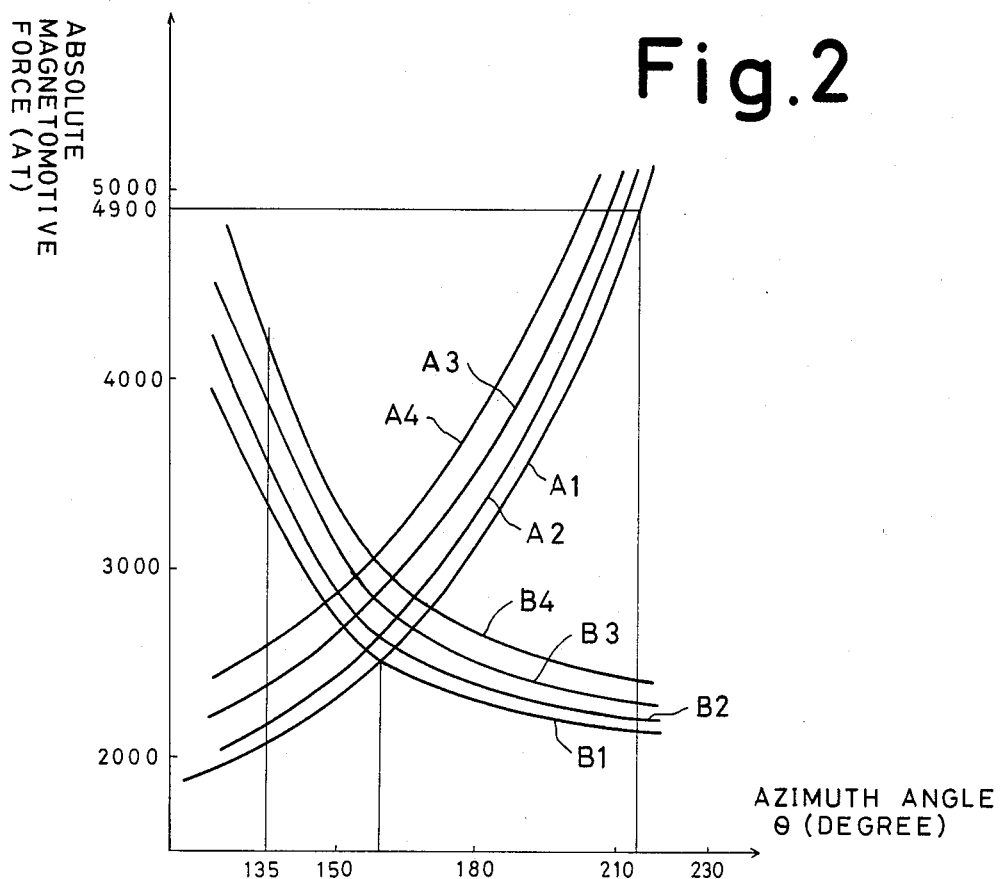
FIG. 2 is a graph showing the relation between the azimuth angle $\theta$ of the final image and absolute magnetomotive forces $|J1|$ and $|J2|$ of the first and second intermediate lenses.

FIG. 2 is a graph showing experimental results of the relation between the azimuth angle $\theta$ of the final image in relation to the absolute magnetomotive force values $|J1|$ and $|J2|$ of the first and second intermediate lenses 4 and 5 in the embodiment shown in FIG. 1 using magnification as a parameter. Said azimuth angle $\theta$ is measured from the base azimuth situation of the specimen to the azimuth situation of the corresponding final image of the specimen on the screen 7 in a clockwise direction. The curves A1, A2, A3 and A4 indicate the absolute magnetomotive force value of the first intermediate lens 4, and the curves B1, B2, B3 and B4 indicate the absolute magnetomotive force value of the second intermediate lens 5. The paired curves (A1, B1) (A2, B2), (A3, B3) and (A4, B4) in the graph are obtained under the condition that magnifications are fixed at X5,000; X10,000; X20,000; X50,000 respectively. Further, at each constant magnification, the objective lens excitation and the projector lens excitation are maintained at some high constant values respectively. However, the excitation of the objective lens is allowed to be varied for image focusing purpose with a very small range.

Figure 3:
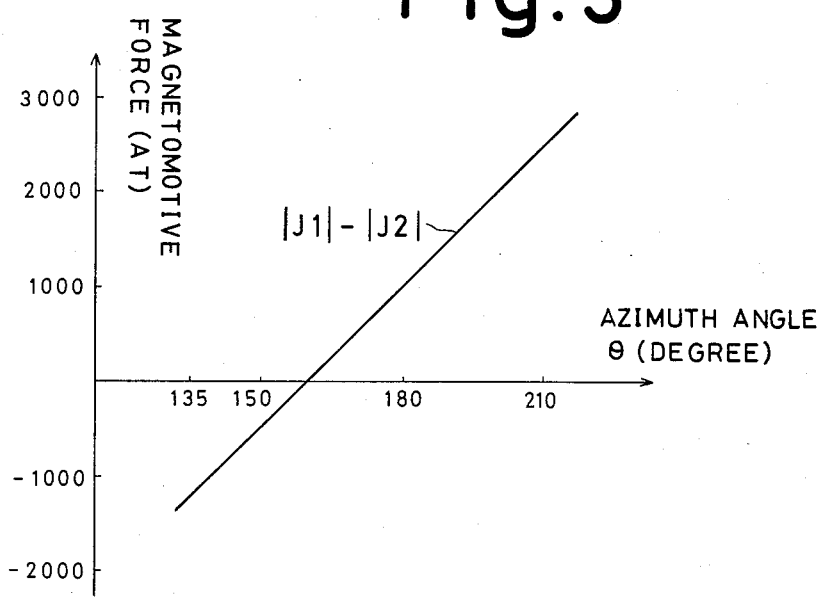
FIG. 3 is a graph showing the relation between the azimuth angle $\theta$ and $(|J1|-|J2|)$.
Figure 4:
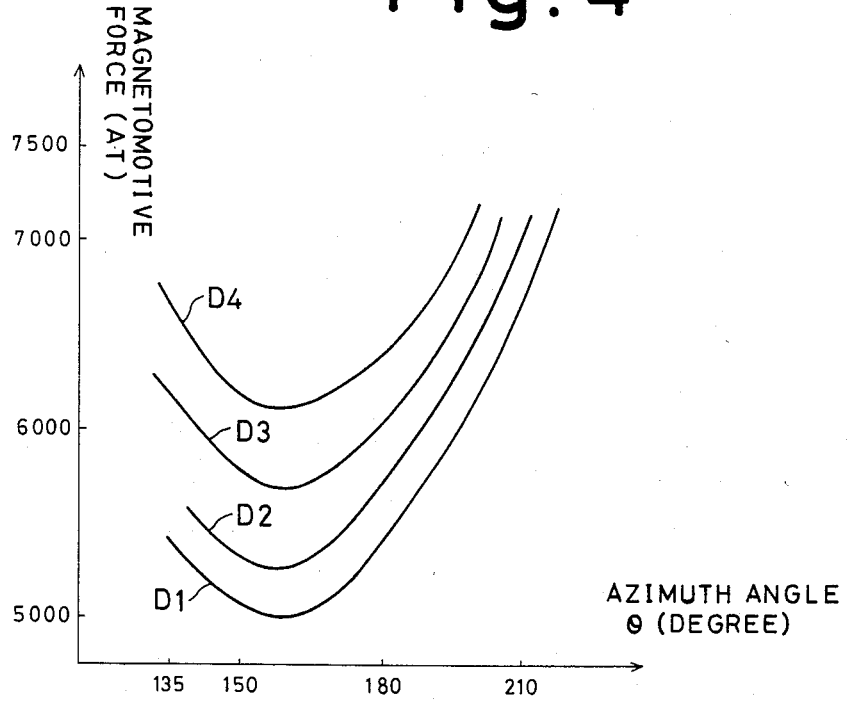
FIG. 4 is a graph showing the relation between the azimuth angle $\theta$ and $(|J1|+|J2|)$.

After the strict examination of FIG. 2, the following two points were found out. First, the difference between $|J1|$ and $|J2|$ in the case of each pair curve is proportional to the azimuth angle $\theta$ as shown in FIG. 3. The straight line showing the relation between said difference and said angle $\theta$ is common to all the paired curves, which are obtained under the different image magnification conditions. Second, the sum of $|J1|$ and $|J2|$ is nearly proportional to the square value of the azimuth angle $\theta$ as shown in FIG. 4. The curves D1, D2, D3, and D4 correspond to the pair curves (A1, B1), (A2, B2) (A3, B3), and (A4, B4) respectively and are similar to a curve of second degree. As a consequence conducted by the above two points, it will be realized that the final image can be rotated by the desired angle without the changes in magnification of said final image by controlling the magnetomotive forces of the two intermediate lenses according to the relation shown in FIGS. 3 and 4.

MODE MA

In the embodiment shown in FIG. 1, the absolute magnetomotive force $|J1|$ and $|J2|$ cannot exceed maximum value 4900 AT (ampere turns) in usual operation due to the limitation of the lens power supplies 9 and 10 and other factors. The curve A1 in FIG. 2 exceeds maximum value 4900 AT at azimuth angle 215°. So, the azimuth angle value 215° is defined as an upper limit angle value in the operation mode (hereafter called mode MA) for controlling the magnetomotive forces of the first and second intermediate lens together as mentioned above.

Figure 5:
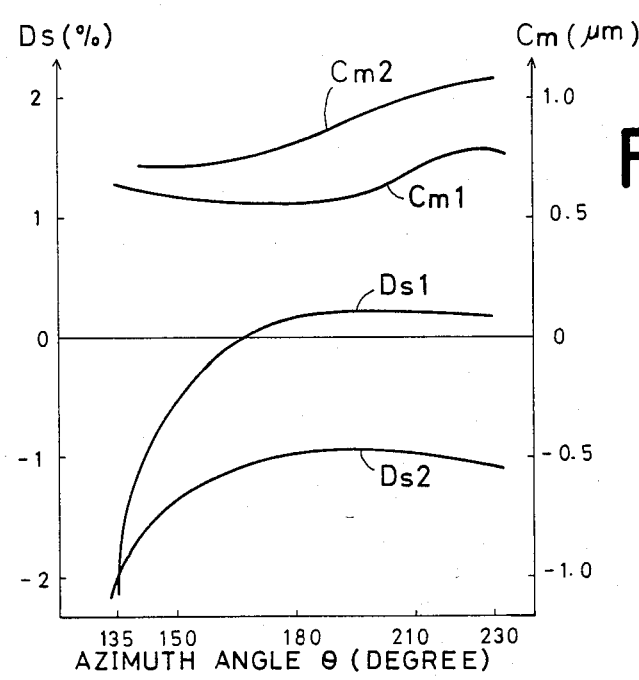
FIG. 5 is a graph showing aberrations in the operation mode according to the invention.

The aberration which must be carefully avoided in the control of the image forming lens system includes radial distortion, spiral distortion, chromatic aberration of magnification, and so on. The radial distortion presents a more important problem than any other kind of aberration particularly in a low magnification range. In the usual electron microscope, the value of radial distortion Ds (%) must be within the range of $-2\%$ to $+2\%$. FIG. 5 shows the radial distortion Ds, which distorts the final image, and the chromatic aberration of magnification Cm ($\mu$m), which obscures the peripheral field of the image, under the condition of mode MA in relation to the azimuth angle $\theta$. In the figure, the curves Cm1 and Cm2 indicating the chromatic aberration of magnification and curves Ds1 and Ds2 indicating the radial distortion are obtained under the constant magnification of X10,000. The curves Cm1 and Ds1 are obtained when the magnetomotive force JP of the projector lens is maintained at 3200 AT, and the curves Cm2 and Ds2 are obtained when the magnetomotive force JP is maintained at 2300 AT. As is noted from FIG. 5, the aberration value decreases as the magnetomotive force JP increases, and the curves Ds1 and Ds2 are less than $-2\%$ when the azimuth angle $\theta$ is less than 135°. Further, it is noted that curves Cm1 and Cm2 are maintained at negligible value in the wide azimuth angle range. Accordingly, the azimuth angle value 135° is defined as a lower limit angle value in the mode MA. And the azimuth angle range in the mode MA is defined to be 135°~215° in the embodiment shown in FIG. 1.

This invention is based on the aforementioned results and considerations. Namely, the relation as shown in FIGS. 3 and 4 corresponding to each magnification value is previously measured by experiment or by computer simulation, and the measured data is memorized (for example, in look-up tables for selected magnifications relating rotation angle to J1 and J2 values) in the lens control unit, and then the lens control unit controls J1 and J2 so that the said relation satisfies the azimuth angle designated by the operator.

Operation of the image rotation according to the invention is carried out as follows.

After observing orientation of the field view of the image and the photographed area indicated on the screen 7 by line mark, the operator designates the desired rotation direction of the image on the screen 7 and the desired rotation angle within said azimuth angle range by operating the switch or switches (not shown) of the azimuth angle designation means 14. In the azimuth angle designation means 14, the value of the memorized initial azimuth angle $\theta_o$ is adjusted in response to said designated direction of image rotation and rotation angle. An azimuth angle signal corresponding to the value of the new corrected azimuth angle $\theta$ is supplied to the lens control unit 12. The lens control unit 12 generates control signals to the lens power supplies 9 and 10 corresponding to the supplied azimuth angle signal by referring to previously memorized data, so that the aforementioned relation is satisfied.

MODES MB1 and MB2

The paired curves shown in FIG. 2 are some examples showing operation mode MA utilizing magnification values as a parameter under the constant magnetomotive force (JP=2800 AT) of the projector lens. When the magnetomotive force JP is changed as a parameter and magnification is kept constant, the paired curves (A1, B1), . . . (A4, B4) are shifted slightly along the abscissa, and the aforementioned angle range in mode MA is also changed.

Figure 6:
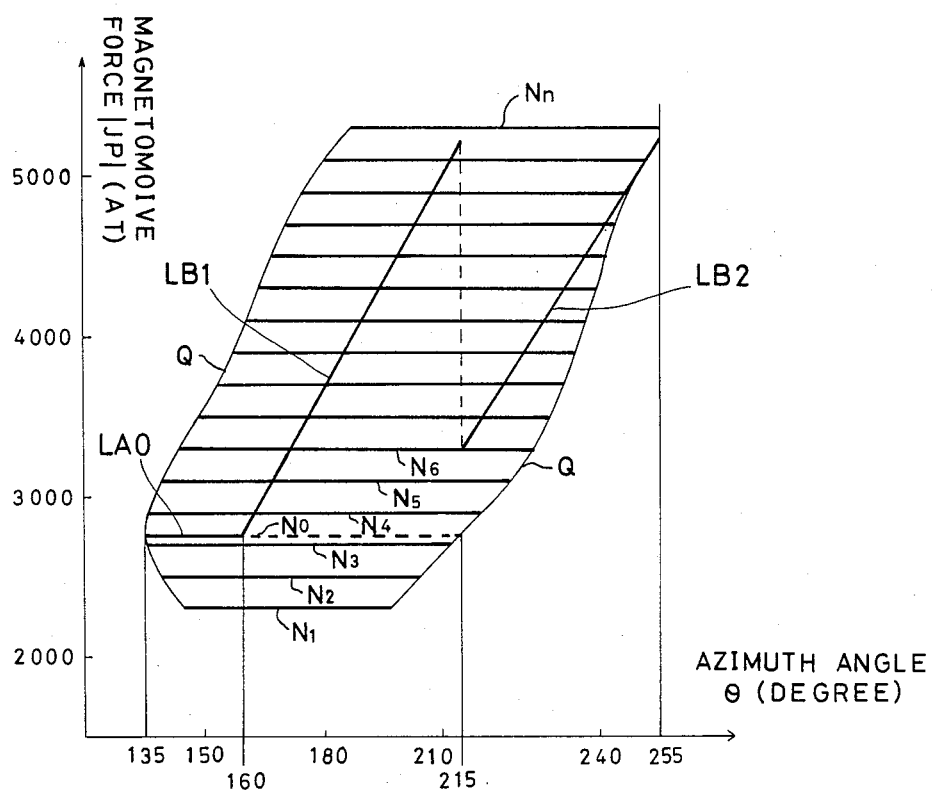
FIG. 6 is a graph for explaining the other operation mode according to the invention.

FIG. 6 shows the angle range in mode MA as a line N1, N2, N3 . . . Nn parallel to the abscissa utilizing absolute magnetomotive force |JP| as a parameter. Broken line No in the figure corresponds to the angle range in the case of paired curves (A1, B1) in FIG. 2. An envelope curve Q shown in FIG. 5 means the area, inside which the limitation of radial distortion range $-2\%$ to $+2\%$ and maximum magnetomotive force value 4900 AT of the intermediate lenses and constant magnification X5,000 is satisfied. It is apparent from FIG. 6 that wide azimuth angle range defined by the lower limit azimuth angle 135° and the upper limit azimuth angle 255° is not obtained by using one operation mode corresponding to one of many line N1, N2, . . . Nn. Therefore, the lens control unit 12 controls the magnetomotive force J1 and J2 in mode MA as shown by line LA0 in FIG. 6 only in low angle range 135°~160°, and controls J1 and J2 in other modes MB1 and MB2 as shown by lines LB1 and LB2, |J1| and |J2| are maintained at almost constant values, and only the magnetomotive force |JP| of the projector lens is decreased or increased by the lens control unit 12.

Figure 7:
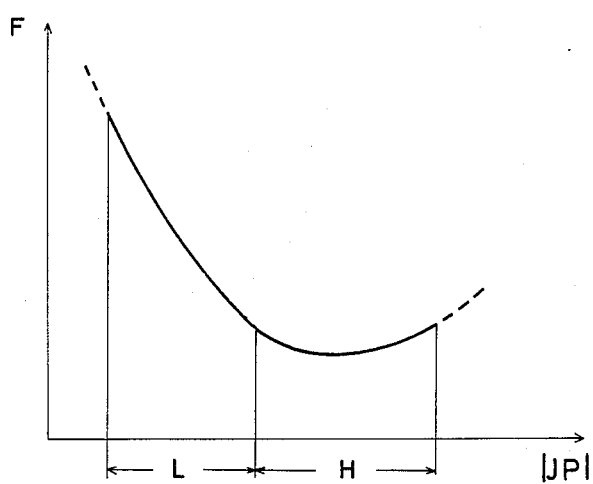
FIG. 7 is a graph showing the relation between the magnetomotive force and focal length in an electromagnetic lens.

FIG. 7 shows the relation between |JP| and the focal length F in the usual electromagnetic lens. In the usual image forming lens system, the projector lens is excited in the low range L of the magnetomotive force |JP|. On the contrary, in said modes MB1 and MB2, the projector lens is excited in high range H of magnetomotive force |JP|. In high range H of |JP|, the change of the focal length is kept small, so that image magnification is maintained almost constant regardless of the change of |JP|.

Figure 8:
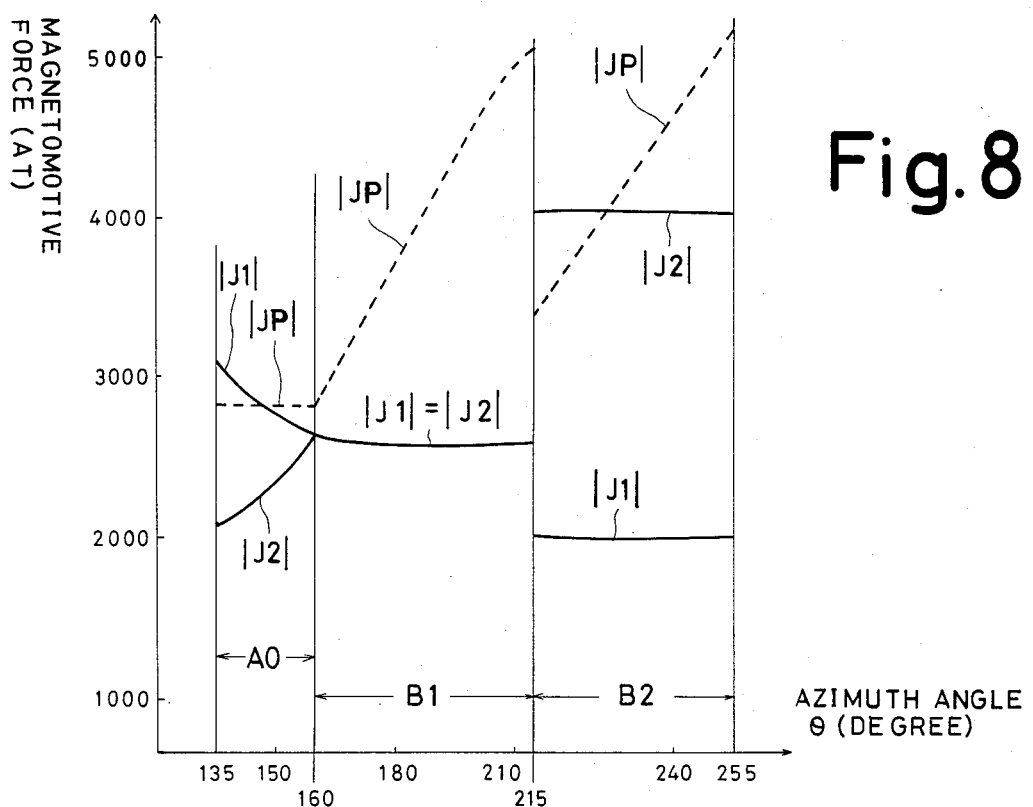
FIG. 8 is a graph showing the relation between the azimuth angle $\theta$ and absolute magnetomotive force of the first and second intermediate lenses and the projector lens according to the invention.

FIG. 8 is a graph showing |J1|, |J2| and |JP| in relation to azimuth angle $\theta$ in the case that aforementioned operation modes MA, MB1, and MB2 are selected according to the azimuth angle signal of the azimuth angle designation means 14 by the lens control unit 12 and magnification is kept at X5,000. Angle ranges A0, B1 and B2 in the graph correspond to the operation modes MA, MB1 and MB2 respectively. Angle range A0 corresponds to a lower angle side within the aforementioned angle range in the mode MA. And, in the higher angle side within the aforementioned angle range in the mode MA, the operation mode MB1 is used instead of the mode MA, because the operation of the mode MB1 is more simple than that of the mode MA. At the upper limit angle 160° of the angle range A0, the values |J1| and |J2| are equal to each other. Operation modes MB1 and MB2 are different only in that |J1| equals |J2| in mode MB1 and |J1| is different from |J2| in mode MB2.

Figure 9:
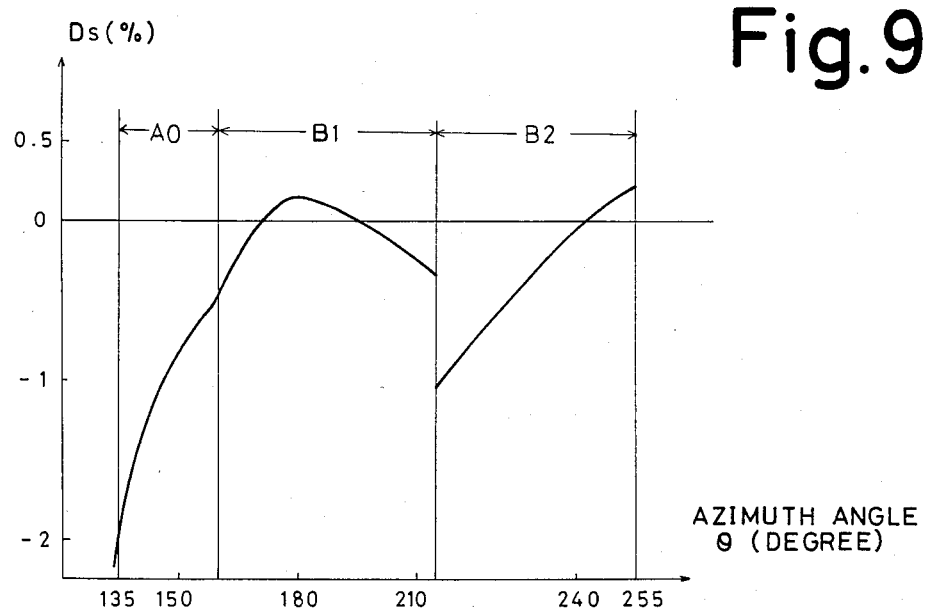
FIG. 9 is a graph showing radial distortion in operation as shown in FIG. 8.

FIG. 9 is a graph showing radial distortion Ds in relation to azimuth angle $\theta$ under the same condition that the graph shown in FIG. 8 is obtained. It is noted from FIG. 9 that the radial distortion is very low in operation modes MB1 and MB2. Further, based upon calculations it is assumed that various aberrations other than radial distortion present no significant increase within the angle range 135°~215°.

Additionally, the lines and curves in FIG. 8 are changed according to the other magnification value (except X5,000) and other electron beam accelerating voltage (except 200 KV). Accordingly, it is necessary that many relations between the |J1|, |J2|, |JP| and azimuth angle $\theta$ corresponding to the various conditions are memorized in the lens control unit 14.

Although the invention has been described by way of the example, it is equally possible to apply the invention to an image forming lens system comprising more than four separate electromagnetic lenses by controlling the three lenses in the lens system utilizing the aforementioned operation modes.

Having thus described the invention with the details and particularity required by the Patent Laws, what is desired protected by Letters Patent is set forth in the following claims.

I claim:

1. An electron microscope comprising:
    (a) an image forming lens system consisting of an objective lens, a projector lens and at least two intermediate lenses between the objective lens and the projector lens,
    (b) a means for generating a signal indicative of a desired azimuth angle $\theta$ of the image formed by said lens system, and
    (c) a means for controlling the magnetomotive forces (J1, J2) of said intermediate lenses in response to said azimuth angle signal such that
        (c1) the difference between the absolute values of said magnetomotive forces (|J1|−|J2|) is proportional to said azimuth angle $\theta$,
        (c2) the sum of the absolute values of said magnetomotive forces (|J1|+|J2|) is nearly proportional to the square of said azimuth angle $\theta$, and
        (c3) the direction of image rotation due to said intermediate lenses is always opposite with respect to each other;
    whereby focal length and magnification remain substantially unchanged as the said azimuth angle is varied between limits.

2. The invention as claimed in claim 1 wherein the means for controlling further controls the magnetomotive force in the projecting lens at a preselected constant value.

3. The invention as claimed in claim 1 wherein the means for controlling further comprise a computer with look-up tables stored in memory corresponding to magnification and rotation and having set forth therein values indicative of the magnetomotive forces (J1, J2) corresponding thereto.

4. An electron microscope comprising
    (a) an image forming lens system consisting of an objective lens, a projector lens and at least two intermediate lenses between the objective lens and the projector lens,
    (b) means for generating a signal indicative of a desired azimuth angle $\theta$ of the image formed by said lens system, and
    (c) means for controlling the magnetomotive forces (J1, J2, JP) of said intermediate lenses and said projector lens in response to said azimuth angle signal such that
        (c1) the direction of image rotation due to said intermediate lenses is always opposite with respect to each other,
        (c2) the magnetomotive forces (J1, J2) of said intermediate lenses are maintained at constant values, and
        (c3) the magnetomotive force (JP) of said projector lens is proportional to said azimuth angle $\theta$,
    whereby focal length and magnification remain substantially unchanged as the said azimuth angle is varied between limits.

5. The invention as claimed in claim 4 wherein the means for controlling further comprises a computer with look-up tables stored in memory corresponding to magnification and rotation and having set forth therein values indicative of the magnetomotive forces ($|J1|=|J2|$ and $|JP|$) corresponding thereto.

6. An electron microscope comprising
   (a) an image forming lens system consisting of an objective lens, a projector lens and at least two intermediate lenses between the objective lens and the projector lens,
   (b) means for generating an azimuth angle signal corresponding to desired azimuth angle within first and second azimuth angle ranges of the image by said lens system, and
   (c) means for controlling the magnetomotive forces (J1, J2, and JP) of said intermediate lenses and said projector lens according to said azimuth angle signal such that
      (c1) the direction of image rotation due to said intermediate lenses is always opposite with respect to each other,
      (c2) the difference ($|J1| - |J2|$) between the absolute values of said magnetomotive forces in said intermediate lenses is proportional to said azimuth angle $\theta$ within said first azimuth angle range,
      (c3) the sum ($|J1| + |J2|$) of the absolute values of said magnetomotive forces in said intermediate lenses is nearly proportional to the square of said azimuth angle $\theta$ within said first azimuth angle range,
      (c4) the magnetomotive force (JP) in said projector lens is proportional to said azimuth angle $\theta$ within said second azimuth angle range and the magnetomotive forces ($|J1|$ and $|J2|$) of said intermediate lenses are maintained at constant values,
   whereby the first range of azimuth angles is selected for magnetomotive force values (JP) of the projector lens where variation of the said force (JP) would cause a variation of magnification with rotation of the azimuth angle and the second range of azimuth angles is selected for magnetomotive force values (JP) of the projector lens wherein variation of the said force (JP) does not substantially cause a variation in magnification with rotation of the azimuth angle.

7. A method of rotating the image of a transmission electron microscope having an objective lens, at least two intermediate lenses and a projector lens comprising the steps for
   (a) adjusting the magnetomotive forces in two intermediate lenses to oppose and
   (b) adjusting the absolute value of the magnetomotive forces in the two intermediate lenses and the projector lens such that the image rotates without a substantial change in magnification.

* * * * *